United States Patent [19]
Yaoi et al.

[11] Patent Number: 5,707,746
[45] Date of Patent: Jan. 13, 1998

[54] THIN FILM TRANSISTOR DEVICE WITH ADVANCED CHARACTERISTICS BY IMPROVED MATCHING BETWEEN A GLASS SUBSTRATE AND A SILICON NITRIDE LAYER

[75] Inventors: Yoshihumi Yaoi, Yamatokoriyama; Yoko Katsuya, Nara; Shuhei Tsuchimoto, Kitakatsuragi-gun, all of Japan

[73] Assignee: Sharp Kabushiki Kaisha, Osaka, Japan

[21] Appl. No.: 124,620

[22] Filed: Sep. 21, 1993

[30] Foreign Application Priority Data

Sep. 25, 1992 [JP] Japan ................................. 4-256090

[51] Int. Cl.⁶ ................................. B32B 13/00
[52] U.S. Cl. .................... 428/448; 428/698; 428/699; 428/700; 428/701; 428/702; 257/57; 257/59
[58] Field of Search ................. 428/428, 432, 428/433, 699, 700, 701, 702, 698, 704, 446, 448; 501/66, 69; 257/192, 194, 195, 903, 904, 57, 59; 330/250, 277

[56] References Cited

U.S. PATENT DOCUMENTS

| | | |
|---|---|---|
| 4,935,792 | 6/1990 | Tanaka .................. 257/59 |
| 4,948,231 | 8/1990 | Aoki .................... 257/59 |
| 4,960,719 | 10/1990 | Tanaka ................. 257/59 |
| 5,042,918 | 8/1991 | Suzuki .................. 257/59 |
| 5,054,887 | 10/1991 | Kato .................... 257/59 |
| 5,070,379 | 12/1991 | Nomoto ................. 257/59 |
| 5,075,244 | 12/1991 | Sakai ................... 257/59 |
| 5,116,787 | 5/1992 | Dumbaugh, Jr. ........... 501/66 |
| 5,116,789 | 5/1992 | Dumbaugh, Jr. ........... 501/66 |

FOREIGN PATENT DOCUMENTS

| | | |
|---|---|---|
| A-0 152 624 | 8/1985 | European Pat. Off. . |
| 61-81666 | 4/1986 | Japan . |
| 64-37870 | 2/1989 | Japan . |
| 4-57098 | 9/1992 | Japan . |

OTHER PUBLICATIONS

Glass Engineering Handbook, McGraw-Hill, Inc., New York, NY, pp. 17–18, Sep. 1958.
Pollack, et al., "IEEE Electronic Device Letters", 5, No. 11, 1984, 468–470.
Patent Abstracts of Japan, vol. 16, No. 354 (E–1242) 30 Jul. 1992 & JP–A–04 111 362 (Canon Inc) 13 Apr. 1992—Partial Translation.
Patent Abstracts of Japan, vol. 13, No. 232 (E–765) 29 May 1989 & JP–A–01 037 870 (Seiko Epson Corp) 8 Feb. 1989 & partial translation.
Patent Abstracts of Japan, vol. 13, No. 26 (E–706) 20 Jan. 1989, & JP–A–63 228 757 (Komatsu Ltd.), 22 Sep. 1988 and partial translation.
Patent Abstracts of Japan, vol. 6, No. 248 (P–160), 7 Dec. 1982 & JP–A–57 146 252 (Hoya Denshi : KK), 9 Sep. 1982 and partial translation.
Credelle, "Thin–Film Transistors for Video Applications", Conference Record of the 1988 International Display Research Conference Hyatt Islandia, San Diego, California Oct. 4–6, 1988, pp. 208–214.
Okumura et al, "Ferroelectric Liquid–Crystal Shutter Array with Poly–Si TFT Driver", Conference Record of the 1988 International Display Conference Hyatt Islandia, San Diego, California, Oct. 4–6, 1988, pp. 174–177.
Saito, "Annealing Effect on the Resistivity of Polycrystalline Silicon Films Passivated with Plasma–Deposited Silicon–Nitride Films", Journal of Applied Physics, vol. 63, No. 4, 15 Feb. 1988, New York, US, pp. 1117–1120.
Pollack et al.; IEEE Electron Device Letters, vol. EDL–5, No. 11; Nov. 1984; "Hydrogen Passivation of Polysilicon MOSFET's from a Plasma Nitride Source," pp. 468–470.

*Primary Examiner*—Timothy Speer
*Attorney, Agent, or Firm*—Nixon & Vanderhye P.C.

[57] ABSTRACT

A thin film semiconductor device including an insulating substrate; and a structure provided on the insulating substrate and including a silicon layer containing hydrogen diffused therein and a silicon nitride layer. The insulating substrate is formed of an insulating material having a thermal expansion coefficient of $2.6 \times 10^{-6}$ deg$^{-1}$ or more or having a distortion point of 850° C. or lower.

14 Claims, 11 Drawing Sheets

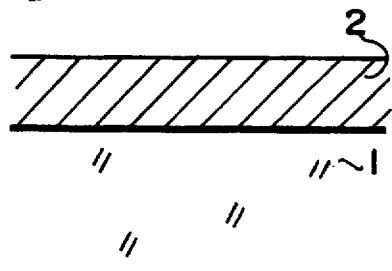
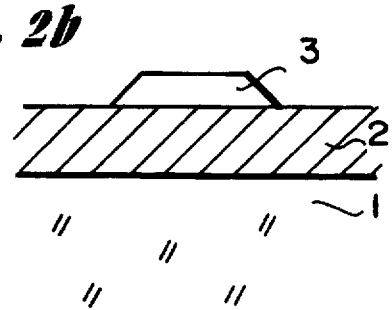
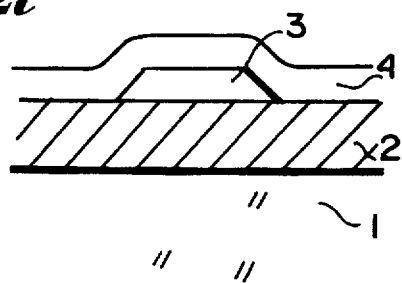
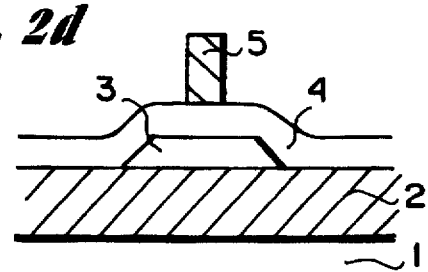
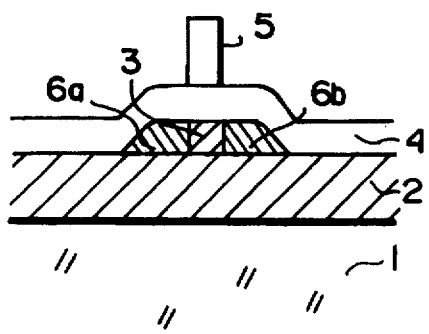
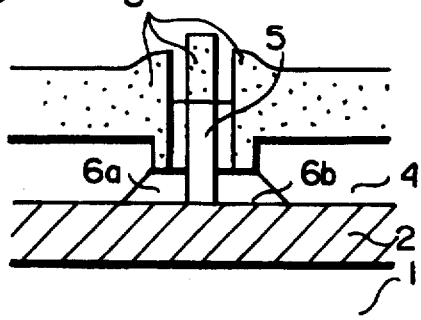
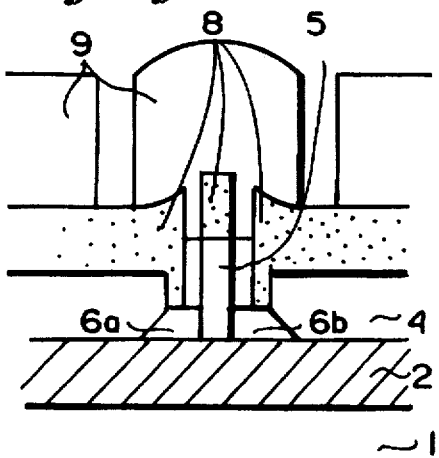

THIN FILM TRANSISTOR DEVICE WITH ADVANCED CHARACTERISTICS BY IMPROVED MATCHING BETWEEN A GLASS SUBSTRATE AND A SILICON NITRIDE LAYER

BACKGROUND OF THE INVENTION

1. Field of the Invention

The present invention relates to a thin film semiconductor device such as a thin film transistor device, for use in a liquid crystal display device, an image sensor and the like, which is produced at a low temperature, and a method for producing such a thin film semiconductor device.

2. Description of the Related Art

In conventional field effect transistors including an active layer formed of polysilicon, microcrystalline silicon or non-crystalline silicon, a great number of trapping levels and/or surface states are caused by defects in the active layer. The existence of such a great number of trapping levels and/or surface states lowers the mobility of electrons and holes and thus the threshold voltage fluctuates. In order to solve such problems, a so-called "hydrogen passivation method" has been used, by which the defects in the active layer are reduced by hydrogen, thereby lowering the number of defects in an area unit.

As a hydrogen passivation method, the following three methods have been proposed:

(1) Exposing the structure including an active layer to hydrogen plasma at a substrate temperature of 300° C. to 400° C., thereby introducing hydrogen into the active layer (hereinafter, referred to as the "hydrogen plasma method");

(2) Implanting hydrogen ions into the active layer and then annealing the structure including an active layer (hereinafter, referred to as the "hydrogen ion implantation method"); and (3) Coating the structure including an active layer with silicon nitride including hydrogen (hereinafter, referred to as SiN:H) and then annealing the structure, thereby diffusing hydrogen from the silicon nitride layer into the active layer.

According to the hydrogen plasma method or the hydrogen ion implantation method, damage to the active layer cannot be avoided when the hydrogen is introduced or implanted into the active layer. Further, especially in the case where a planar transistor having a gate electrode formed of a silicon material is produced by the hydrogen plasma method, the speed of hydrogen passivation is low, and thus there is a problem in terms of throughput.

Under these circumstances, the method of diffusing hydrogen in the SiN:H layer into the active layer by heating is considered to be advantageous as a hydrogen passivation method. Generally in the case of a thin film transistor including a substrate formed of silicon, hydrogen passivation achieves great effects when a SiN:H having a sufficient compressive stress during the passivation anneal is used (G. P. Pollack et al., "Hydrogen Passivation of Polysilicon MOSFET's from a Plasma Nitride Source", IEEE Electron Devices Lett. vol. EDL-5, No. 11, November, 1984). By contrast, in the case of a transistor having an insulating substrate formed of a material such as quartz, hydrogen passivation does not realize sufficient improvement of transistor characteristics even by use of the above-mentioned SiN:H.

SUMMARY OF THE INVENTION

A thin film semiconductor device according to the present invention includes an insulating substrate; and a structure provided on the insulating substrate and including a silicon layer containing hydrogen diffused therein and a silicon nitride layer. The insulating substrate is formed of an insulating material having a thermal expansion coefficient of $2.6 \times 10^{-6}$ deg$^{-1}$ or more.

In one embodiment of the invention, the insulating substrate is formed of aluminoborosilicate glass.

Alternatively, a thin film semiconductor device according to the present invention includes an insulating substrate; and a structure provided on the insulating substrate and including a silicon layer containing hydrogen diffused therein and a silicon nitride layer. The insulating substrate is formed of an insulating material having a distortion point of 850° C. or lower.

In one embodiment of the invention, the insulating substrate is formed of aluminoborosilicate glass.

Alternatively, a method for producing a thin film semiconductor device according to the present invention includes the steps of forming a silicon layer above a substrate formed of an insulating material having a thermal expansion coefficient of $2.6 \times 10^{-6}$ deg$^{-1}$ or more; forming a silicon nitride layer containing hydrogen above the silicon layer; and heating the silicon nitride layer, thereby diffusing the hydrogen into the silicon layer.

In one embodiment of the invention, the silicon nitride layer is heated at a temperature in the range of 400° C. to 550° C.

In one embodiment of the invention, the silicon nitride layer is formed by a plasma CVD method using a gas containing SiH$_4$ and NH$_3$ mixed therein.

Alternatively, a method for producing a thin film semiconductor device according to the present invention includes the steps of forming a silicon layer above a substrate formed of an insulating material having a distortion point of 850° C. or lower; forming a silicon nitride layer containing hydrogen above the silicon layer; and heating the silicon nitride layer, thereby diffusing the hydrogen into the silicon layer.

In one embodiment of the invention, the silicon nitride layer is heated at a temperature in the range of 400° C. to 550° C.

In one embodiment of the invention, the silicon nitride layer is formed by plasma CVD method using a gas containing SiH$_4$ and NH$_3$ mixed therein.

Thus, the invention described herein makes possible the advantages of providing a method for producing a thin film semiconductor device, by which satisfactory transistor characteristics are indicated in a short period of time after hydrogen passivation starts, and a thin film semiconductor device produced by such a method.

These and other advantages of the present invention will become apparent to those skilled in the art upon reading and understanding the following detailed description with reference to the accompanying figures.

BRIEF DESCRIPTION OF THE DRAWINGS

FIGS. 2a through 2g are cross sectional views taken across line a—a' of FIG. 1, illustrating a method for producing the thin film transistor shown in FIG. 1.

DESCRIPTION OF THE PREFERRED EMBODIMENTS

Hereinafter, the present invention will be described by way of illustrating examples with reference to the accompanying drawings.

EXAMPLE 1

Figure 1:
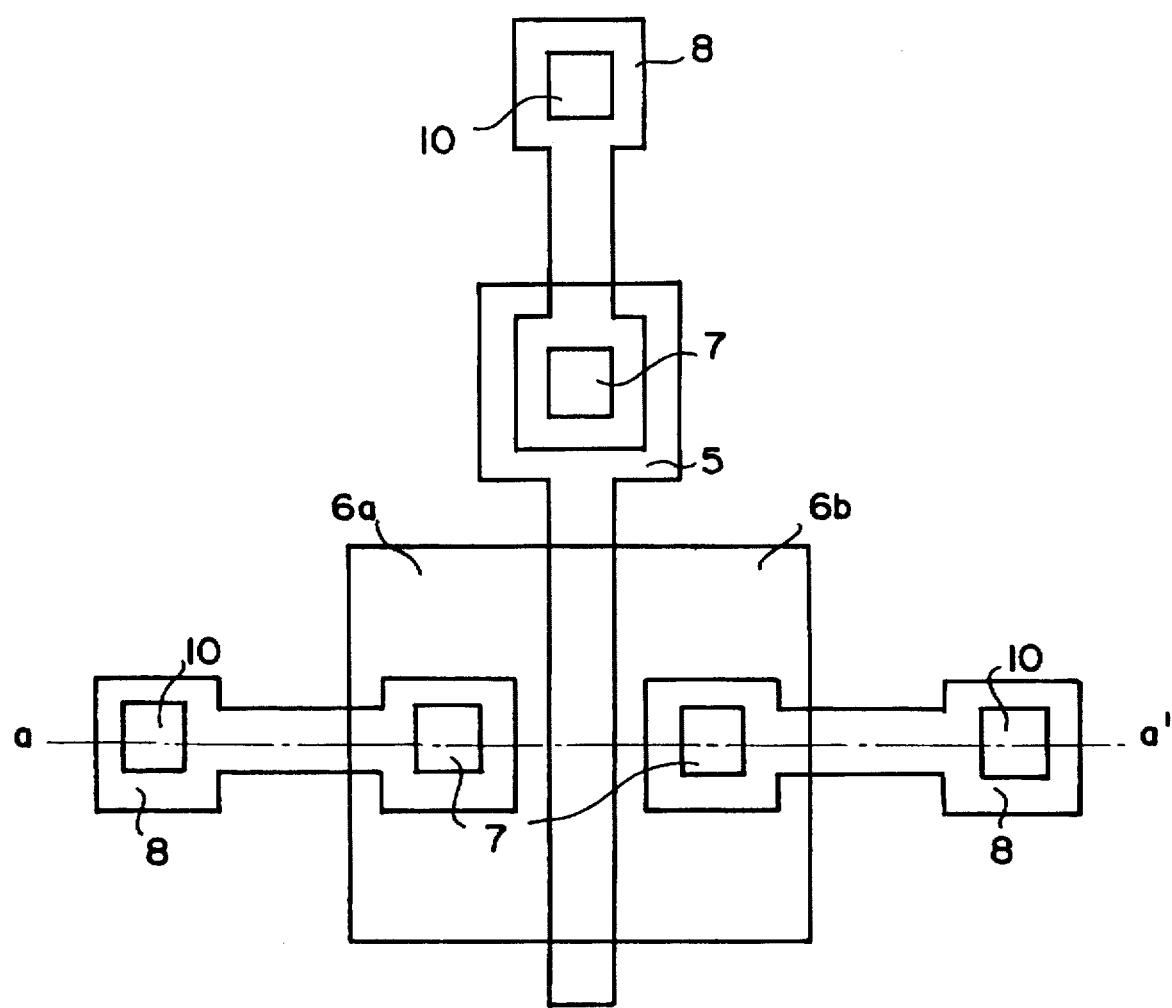
FIG. 1 is a plan view of a thin film transistor in a first example according to the present invention.

FIG. 1 is a plan view of a thin film transistor in a first example according to the present invention. FIGS. 2a through 2g are cross sectional views taken across line a—a' of FIG. 1, illustrating a method for producing the thin film transistor shown in FIG. 1.

A substrate 1 formed of aluminoborosilicate glass having a distortion point of 670° C. and a thermal expansion coefficient of $4 \times 10^{-6}$ deg$^{-1}$ is washed, and then a silicon dioxide layer 2 is formed in a thickness of approximately 500 nm on the substrate 1 in a atmospheric-pressure CVD apparatus as is shown in FIG. 2a. The resultant structure is annealed for approximately 12 hours in an inert gas atmosphere, thereby raising the density of the silicon dioxide layer 2.

In a plasma CVD apparatus, SiH$_4$ is decomposed in plasma with the assistance of heat at a substrate temperature of 450° C., thereby forming a noncrystalline silicon film in a thickness of approximately 100 nm on the silicon dioxide layer 3. The resultant structure is then annealed at 600° C. for approximately 24 hours in an inert gas atmosphere, and thus turned into a polysilicon film. The polysilicon film is then patterned by photolithography to be a polysilicon layer 3 having a pattern of islands as is shown in FIG. 2b.

A silicon dioxide film is formed in a thickness of approximately 100 nm so as to cover the polysilicon layer 3 in a atmospheric-pressure CVD apparatus. The resultant structure is then annealed for approximately 12 hours in an inert gas atmosphere, thereby raising the density thereof. The resultant silicon dioxide film shown in FIG. 2c acts as a gate insulating film 4.

A polysilicon film is formed in a thickness of approximately 300 nm on the gate insulating film 4 in a low pressure CVD apparatus, and then patterned as specified by photolithography, thereby obtaining a gate electrode 5 as is shown in FIG. 2d.

As is shown in FIG. 2e, phosphorus P ions are implanted into the resultant structure through a whole upper surface thereof in an amount of approximately $2 \times 10^{15}$ ions/cm$^2$, and annealing is performed at 600° C. for approximately 20 hours. Thus, the resistances of the gate electrode 5 and portions 6a and 6b of the polysilicon layer 3 are lowered, the portions 6a and 6b acting as a source and a drain, respectively.

As is shown in FIGS. 2f and 1, contact holes 7 and formed in the gate insulating film 4 for connecting both the source 6a and the drain 6b with and aluminum electrode 8 to be formed on the gate insulating film 4. The aluminum electrode 8 is formed in a thickness of approximately 300 nm so as to cover the gate electrode 5 and then patterned as specified by photolithography. The resultant structure is annealed at 440° C. for approximately 30 minutes to obtain ohmic contact between the gate electrode 5 and the aluminum electrode 8, between the source 6a and the aluminum electrode 8, and between the drain 6b and the aluminum electrode 8.

A gas containing SiH$_4$ and NH$_3$ mixed therein is decomposed by plasma at a substrate temperature of 300° C., thereby forming a silicon nitride layer 9 in a thickness of approximately 400 nm on the aluminum electrode 8 by a plasma CVD method as is shown in FIGS. 2g and 1. The silicon nitride layer 9 contains hydrogen in an atomic percent of 1% to 30%. Contact holes 10 are formed in the silicon nitride layer 9 for electrically connecting the aluminum electrode 8 and a conductive layer to be formed thereon (nor shown). The resultant structure is annealed at a temperature in the range of 400° C. to 550° C., thereby diffusing hydrogen in the silicon nitride layer 9 in to the polysilicon layer 3 and the gate electrode 5 which act as an active layer in combination. Such annealing will be referred to as "hydrogen diffusing annealing". Thus, the thin film transistor shown in FIG. 1 is produced.

As a comparative example, another thin film transistor is produced in an identical manner as described above except that quartz is used for a substrate. The quartz used for the substrate has a distortion point of 1000° C. and a thermal expansion coefficient of $5 \times 10^{-7}$ deg$^{-1}$.

FIGS. 3 through 6 shown characteristics of the thin film transistor in the first example according to the present invention and the thin film transistor as the comparative example having a substrate formed of quartz. Both of the thin film transistors were produced in an identical manner in which the hydrogen diffusing annealing was performed at 440° C.

Figure 3:
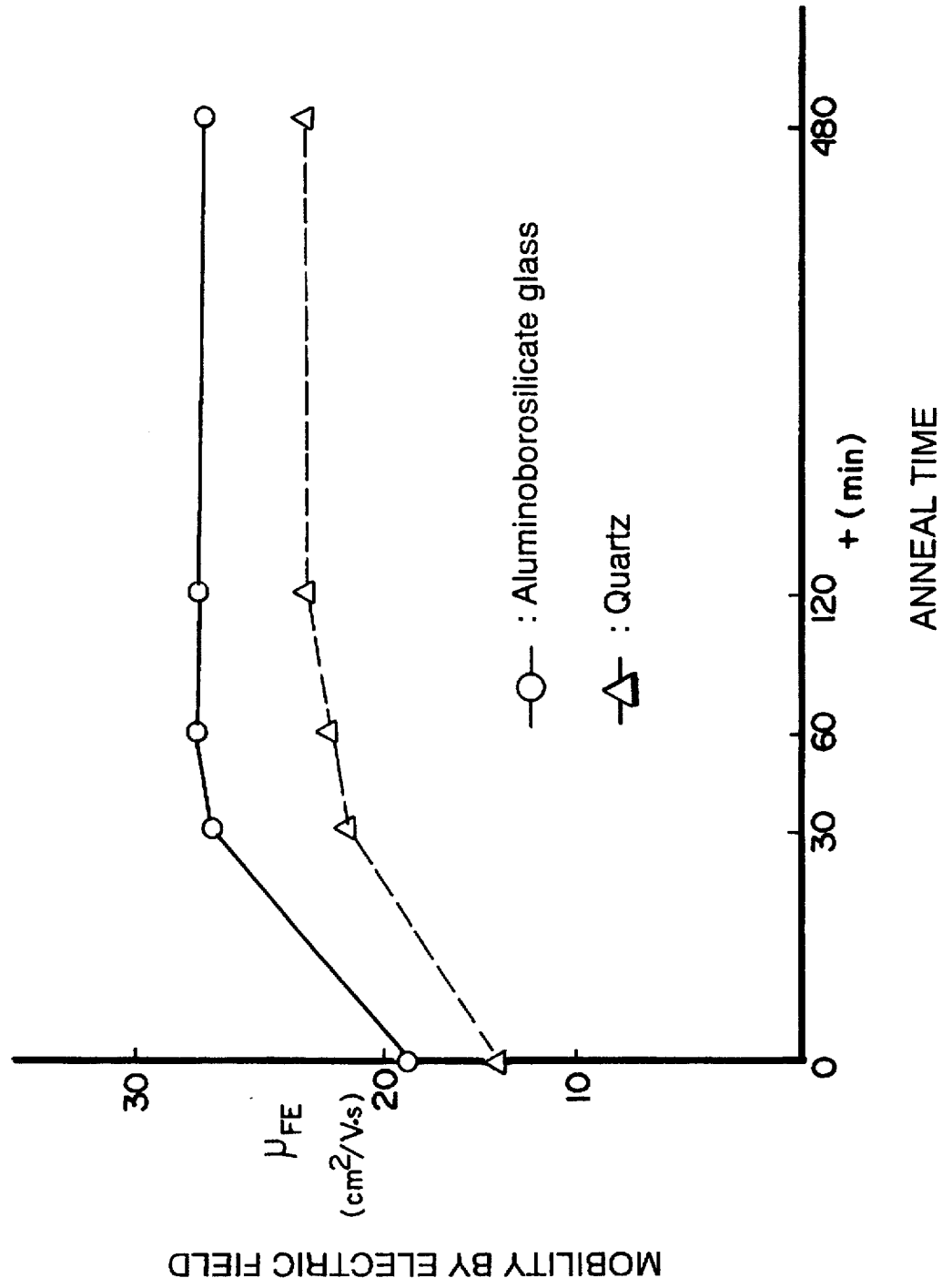
FIG. 3 is a graph illustrating the relationship between the mobility of carriers obtained by applying an electric field and the time duration of the hydrogen diffusing annealing, concerning a thin film transistor in the first example according to the present invention and a thin film transistor as a comparative example.
Figure 4:
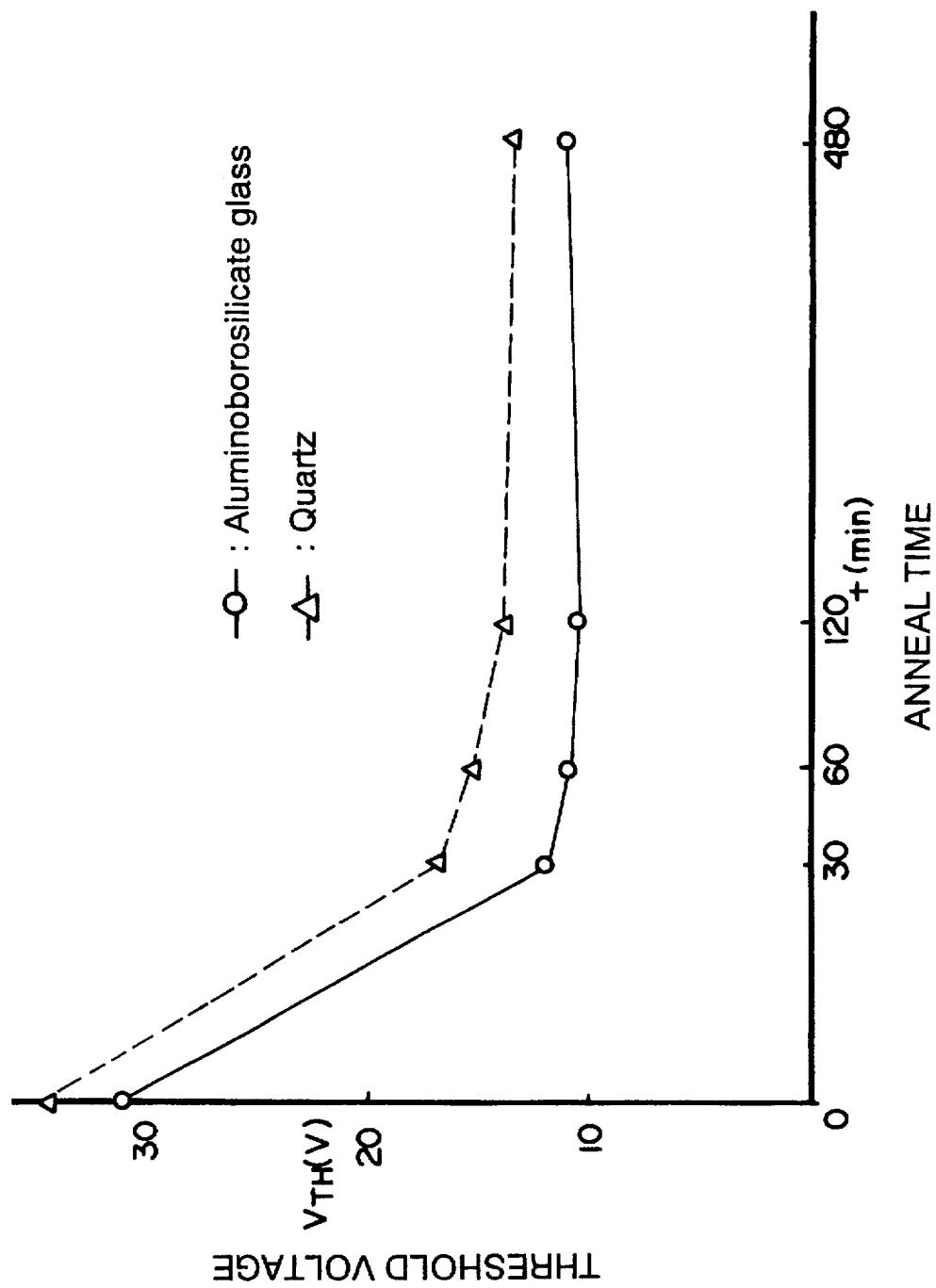
FIG. 4 is a graph illustrating the dependency of the threshold voltage on the time duration of the hydrogen diffusing annealing, concerning the thin film transistor in the first example according to the present invention and a thin film transistor as the comparative example.
Figure 5:
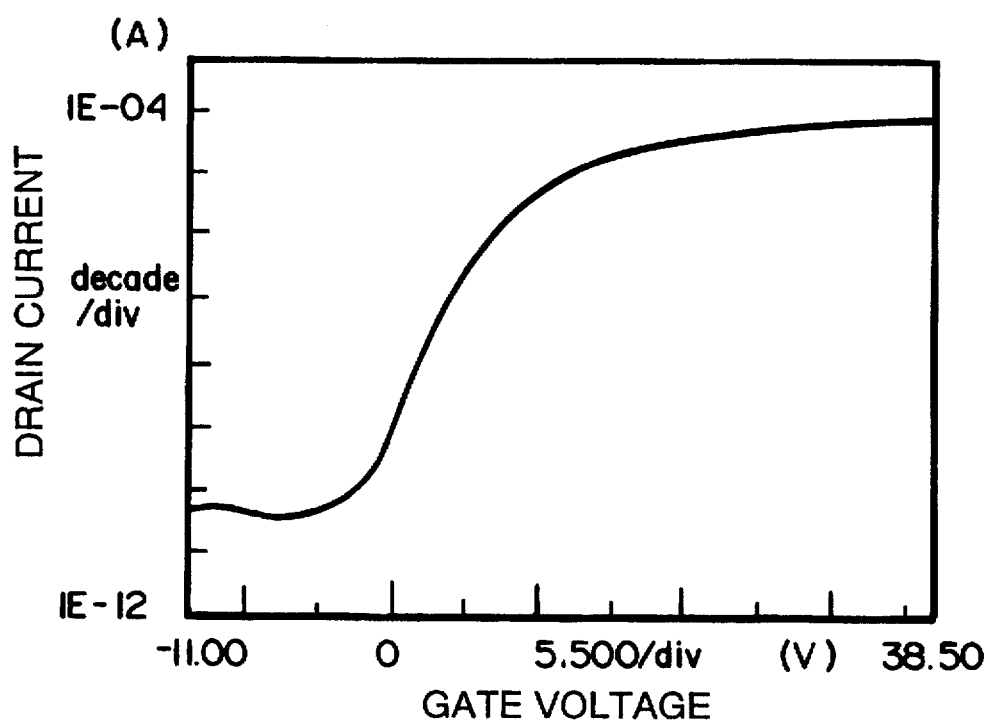
FIG. 5 is a graph illustrating the dependency of the drain current on the gate voltage, concerning the thin film transistor in the first example according to the present invention.
Figure 6:
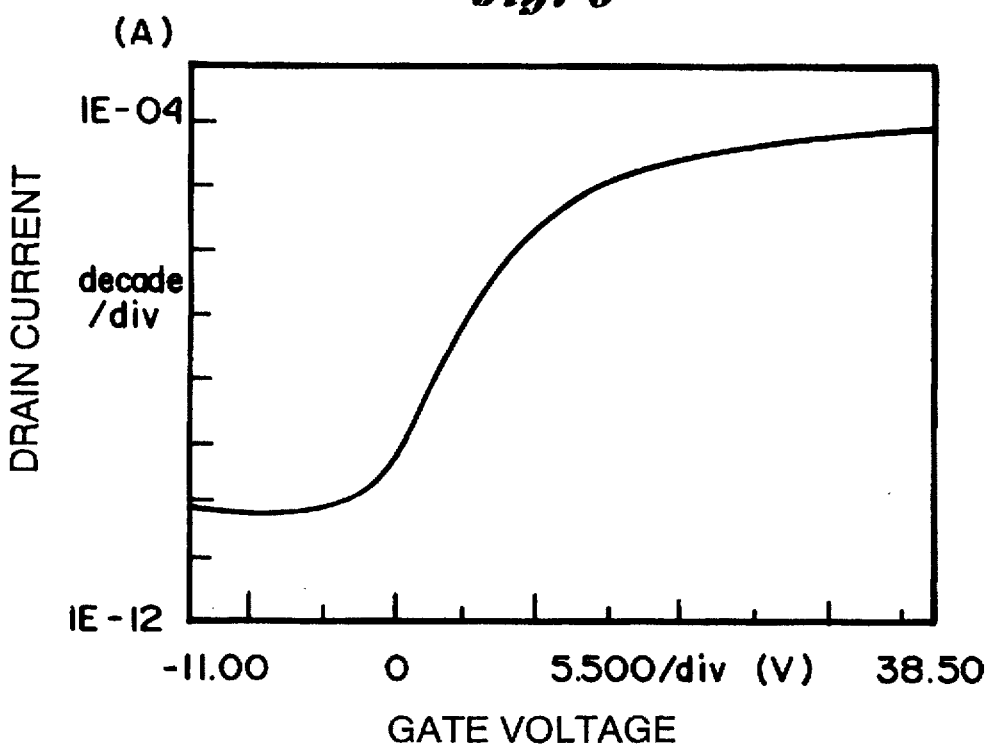
FIG. 6 is a graph illustrating the dependency of the drain current on the gate voltage, concerning a thin film transistor as the comparative example.

FIG. 3 shows the relationship between the mobility of carriers obtained by applying an electric field and the time duration of the hydrogen diffusing annealing. FIG. 4 shows the dependency of the threshold voltage on the time duration of the hydrogen diffusing annealing. In each of FIGS. 3 and 4, the solid line corresponds to the thin film transistor according to the present invention, and the dashed line corresponds to the thin film transistor as the comparative example. FIG. 5 shows the dependency of the drain current on the gate voltage concerning the thin film transistor according to the present invention, and FIG. 6 shows such dependency concerning the thin film transistor as the comparative example. Each thin film transistor has a channel length of 5 μm, a channel width of 50 μm, and a voltage between the drain 6b and the source 6a of 0.5 V. Each transistor is obtained after performing hydrogen diffusing annealing for 8 hours.

It is apparent from FIG. 3 that the mobility of the thin film transistor according to the present invention reaches a saturation state after the hydrogen diffusing annealing is performed for 60 minutes, whereas 120 minutes are necessary until the mobility of the thin film transistor as the comparative example reaches a saturation state. Further, after the hydrogen diffusing annealing is performed for 8 hours, the mobility of the thin film transistor according to the present invention is 29.1 cm$^2$/V·s, whereas that of the thin film transistor as the comparative example is only 23.4 cm$^2$/V·s.

FIG. 4 shows that the threshold voltage reaches a saturation state after the hydrogen diffusing annealing is performed for 120 minutes with both of the thin film transistors. However, after the hydrogen diffusing annealing is performed for 8 hours, the threshold voltage of the thin film transistor according to the present invention is 12.0 V, whereas that of the thin film transistor as the comparative example is 14.2 V.

As is apparent from FIGS. 3 through 6, in the thin film transistor in the first example according to the present invention having a substrate formed of aluminoborosilicate glass, the mobility by the electric field reaches a saturation state in a shorter period of time, and better characteristics are indicated after saturation than the thin film transistor having a substrate formed of quartz.

EXAMPLE 2

Figure 7:
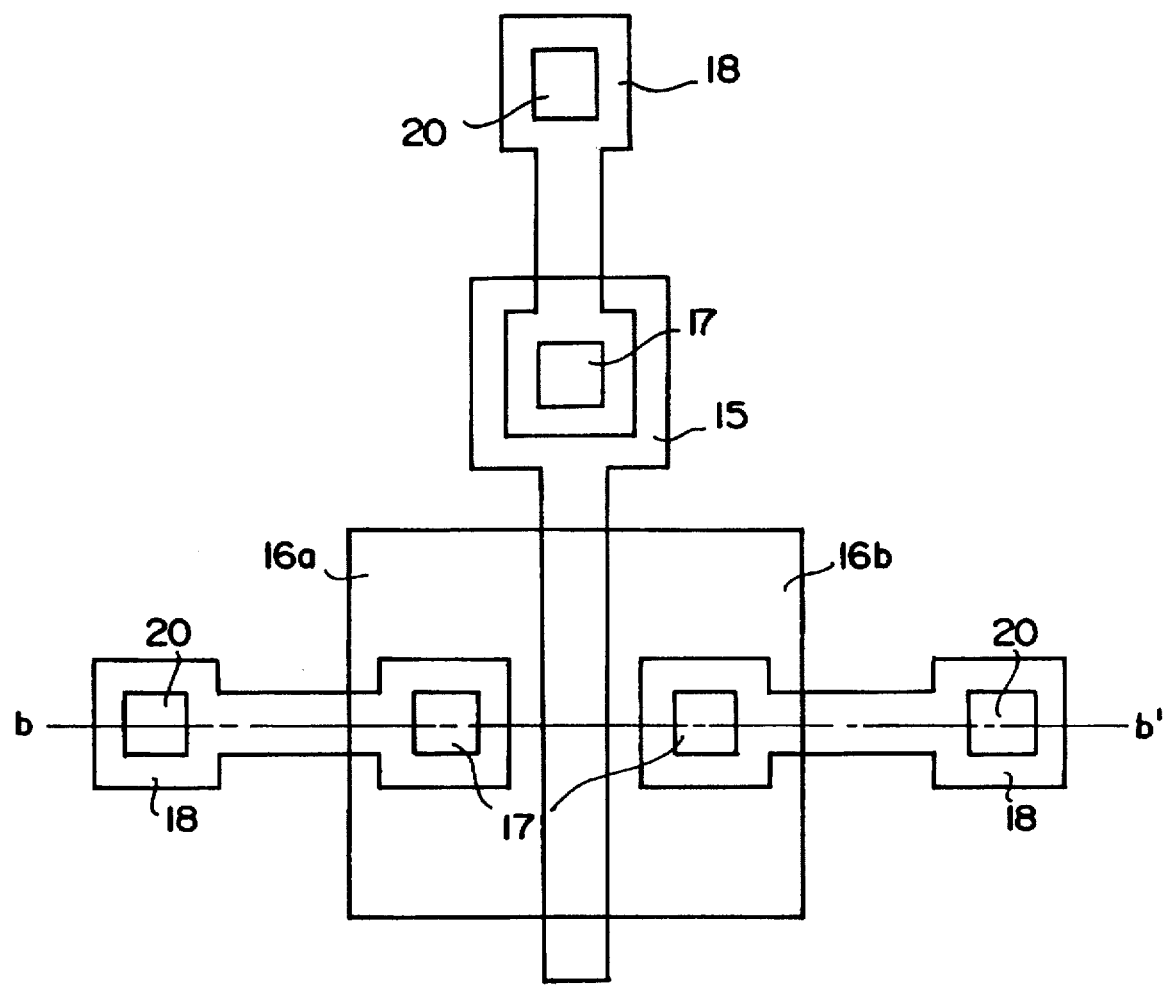
FIG. 7 is a plan view of a thin film transistor in a second example according to the present invention.

FIG. 7 is a plan view of a thin film transistor in a second example according to the present invention. FIGS. 8a through 8g are cross sectional views taken across line b—b' of FIG. 7, illustrating a method for producing the thin film transistor shown in FIG. 7.

In the second example, three types of thin film transistors respectively including substrates 11 formed of three types of glass A, B, and C are formed. The three types of glass A, B and C each have a high distortion point and a thermal expansion coefficient of more than 2.6×10$^{-6}$ deg$^{-1}$ as is shown later in Table 1. Since these thin film transistors are identical except for the type of glass, the production method will be described only once.

Figure 8A:
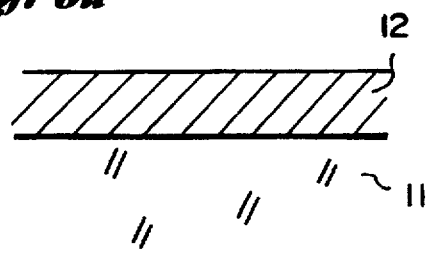
FIGS. 8a through 8g are cross sectional views taken across line b—b' of FIG. 7, illustrating a method for producing the thin film transistor shown in FIG. 7.

The substrate 11 formed of any one of the above-described glass types is washed, and then a silicon dioxide layer 12 is formed in a thickness of approximately 500 nm on the substrate 11 in a atmospheric-pressure CVD apparatus as is shown in FIG. 8a. The resultant structure is annealed for approximately 12 hours in an inert gas atmosphere, thereby raising the density of the silicon dioxide layer 12.

Figure 8B:
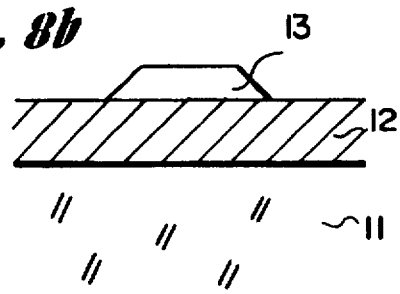
Figure 8C:
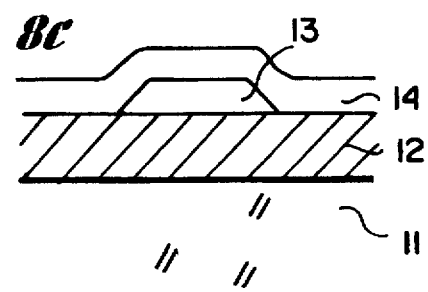

In a low pressure CVD apparatus, Si$_2$H$_6$ is decomposed by heat at a substrate temperature of 450° C., thereby forming a noncrystalline silicon film in a thickness of approximately 100 nm on the silicon dioxide layer 12. The resultant structure is then annealed at 600° C. for approximately 24 hours in an inert gas atmosphere, and thus turned into a polysilicon film. The polysilicon film is then patterned by photolithography, thereby forming a polysilicon layer 13 having a pattern of islands as is shown in FIG. 8b.

A silicon dioxide film is formed in a thickness of approximately 100 nm so as to cover the polysilicon layer 13 in a atmospheric-pressure CVD apparatus. The resultant structure is annealed for approximately 12 hours in an inert gas atmosphere, thereby raising the density thereof. The resultant silicon dioxide film shown in FIG. 8c acts as a gate insulating film 14.

Figure 8D:
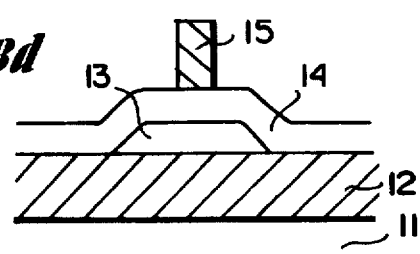

A polysilicon film is formed in a thickness of approximately 300 nm on the gate insulating film 14 in a low pressure CVD apparatus, and then patterned as specified by photolithography, thereby obtaining a gate electrode 15 as is shown in FIG. 8d.

Figure 8E:
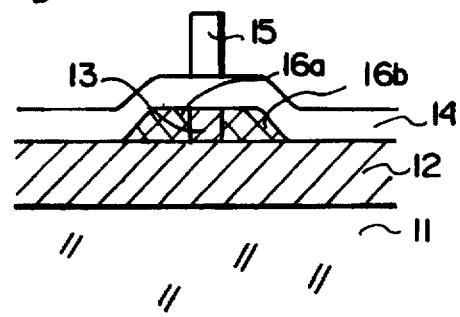

As is shown in FIG. 8e, P ions are implanted into the resultant structure through the whole upper surface thereof in an amount of approximately 2×10$^{15}$ ions/cm$_2$, and annealing is performed at 600° C. for approximately 20 hours. Thus, the resistances of the gate electrode 15 and portions 16a and 16b of the polysilicon layer 13 are lowered, the portions 16a and 16b acting as a source and a drain, respectively.

Figure 8F:
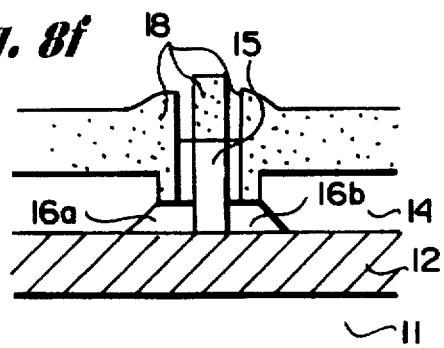

As is shown in FIGS. 8f and 7, contact holes 17 are formed in the gate insulating film 14 for connecting both of the source 16a and the drain 16b with an aluminum electrode 18 to be formed on the gate insulating film 14. The aluminum electrode 18 is formed in a thickness of approximately 300 nm so as to cover the gate electrode 15 and then patterned as specified by photolithography. The resultant structure is annealed at 440° C. for approximately 30 minutes to obtain ohmic contact between the gate electrode 15 and the aluminum electrode 18, between the source 16a and the aluminum electrode 18, and between the drain 16b and the aluminum electrode 18.

Figure 8G:
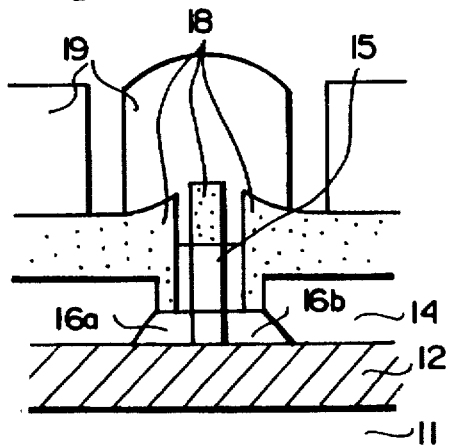

A gas containing SiH$_4$ and NH$_3$ mixed therein is decomposed by plasma at a substrate temperature of 300° C., thereby forming a silicon nitride layer 19 in a thickness of approximately 400 nm by a plasma CVD method as is shown in FIGS. 8g and 7. The silicon nitride layer 19 contains hydrogen in an atomic percent of 1% and 30%. The resultant structure is annealed at a temperature in the range of 400° C. to 550° C., thereby diffusing hydrogen in the silicon nitride layer 19 into the polysilicon layer 13 and the gate electrode 15 which act as an active layer in combination. Such annealing will be referred to as "hydrogen diffusing annealing". Contact holes 20 are formed in the silicon nitride layer 19 for electrically connecting the aluminum electrode 18 and a conductive layer to be formed thereon (not shown). Thus, the thin film transistor shown in FIG. 7 is produced.

As comparative examples, thin film transistors are produced in an identical manner as described above except that quartz and crystal silicon are used for substrates thereof, respectively. The quartz used for the substrate has a distortion point of 1000° C. and a thermal expansion coefficient of 5×10$^{-7}$ deg$^{-1}$.

FIGS. 9 through 13 show characteristics of the thin film transistors in the second example according to the present invention and the thin film transistors as the comparative examples having substrates formed of quartz and silicon. As is mentioned above, the thin film transistors in the second example respectively include substrates formed of glass types A, B and C. All of the thin film transistors were produced in an identical manner in which the hydrogen diffusing annealing was performed at 490° C.

Figure 9:
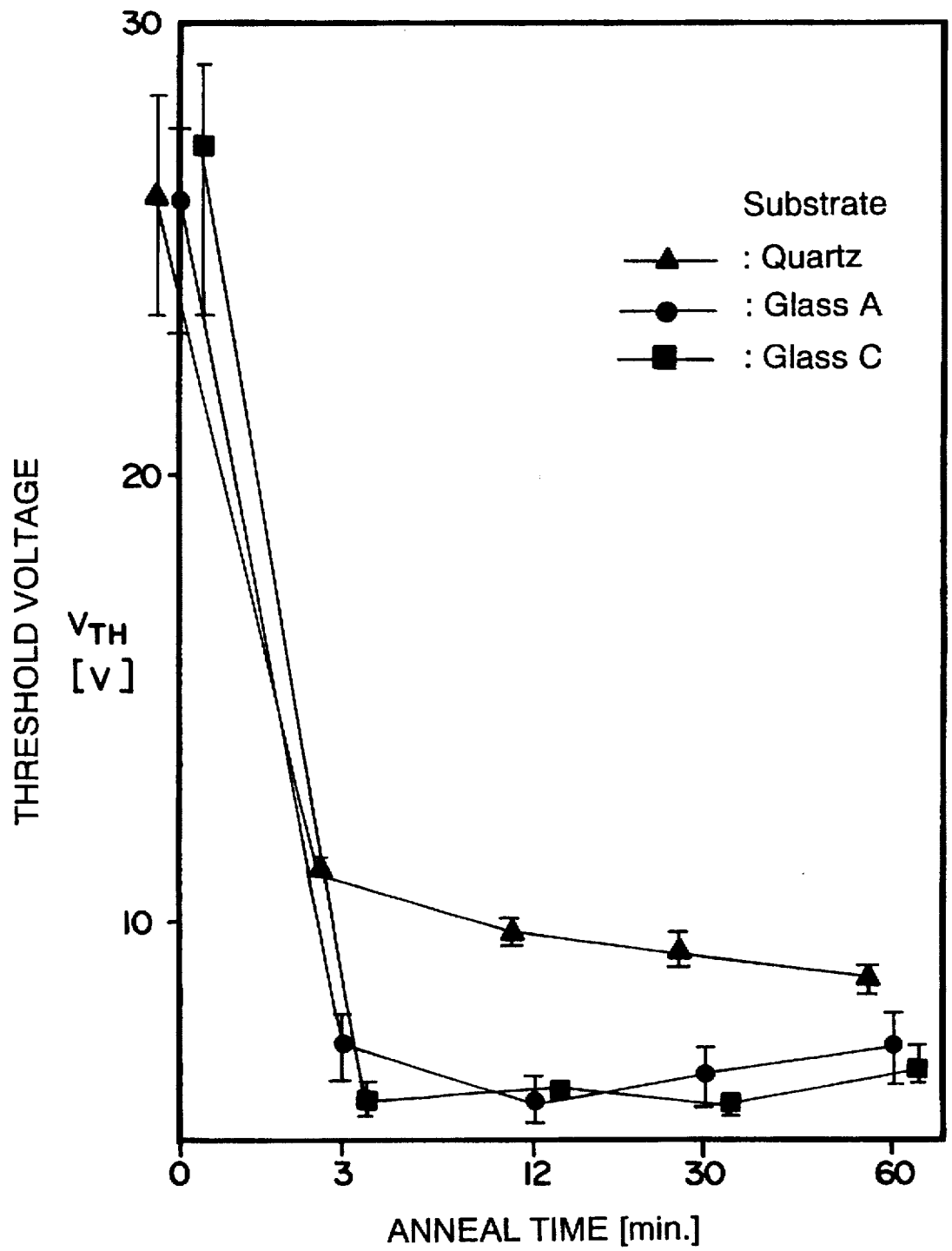
FIG. 9 is a graph illustrating the dependency of the threshold voltage on the time duration of the hydrogen diffusing annealing, concerning thin film transistors in the second example according to the present invention and thin film transistors as comparative examples.
Figure 10:
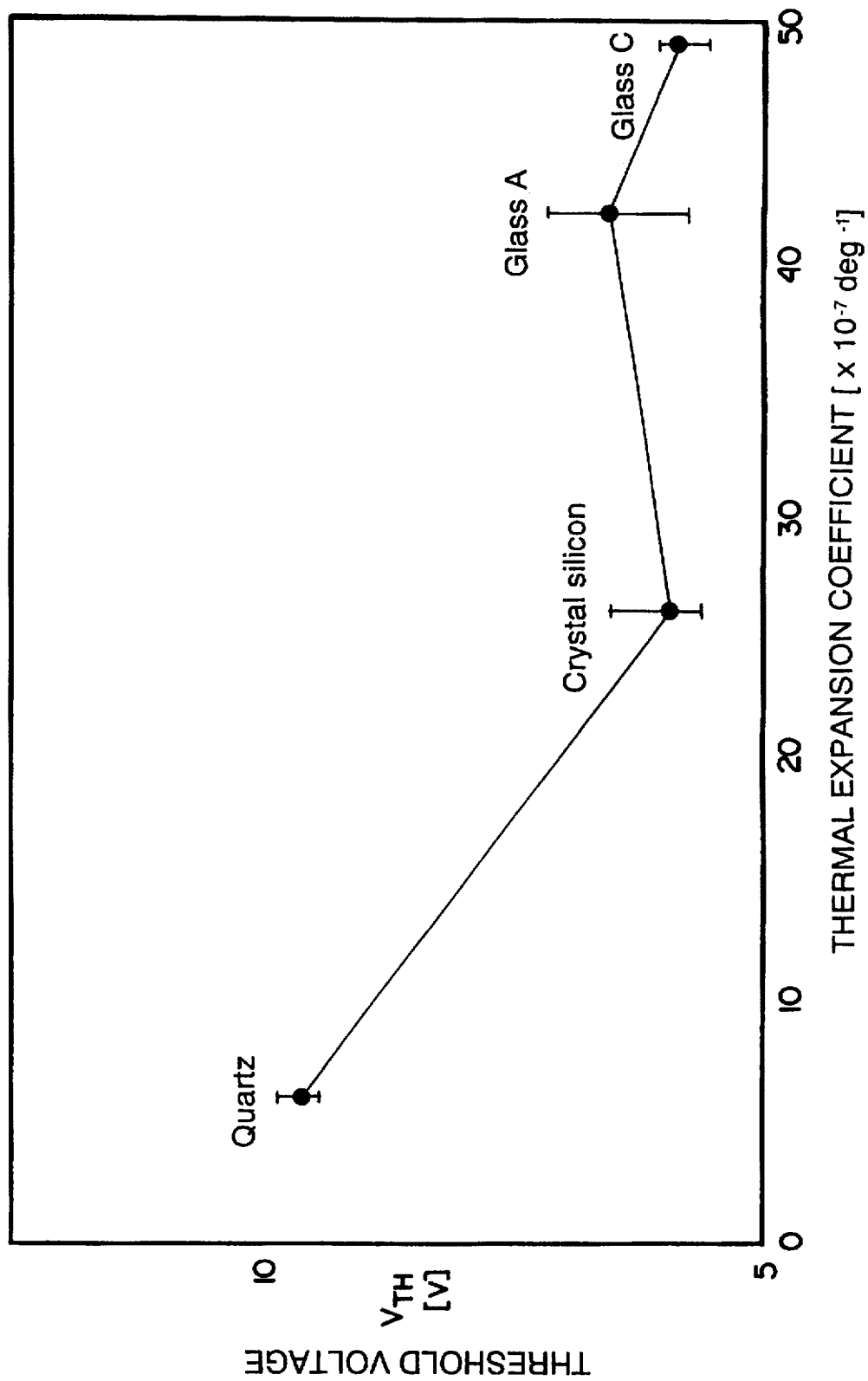
FIG. 10 is a graph illustrating the relationship between the thermal expansion coefficient of the substrate and the threshold voltage obtained after the hydrogen diffusing annealing is performed for 0.5 hours, concerning the thin film transistors in the second example according to the present invention and the thin film transistors as comparative examples.
Figure 11:
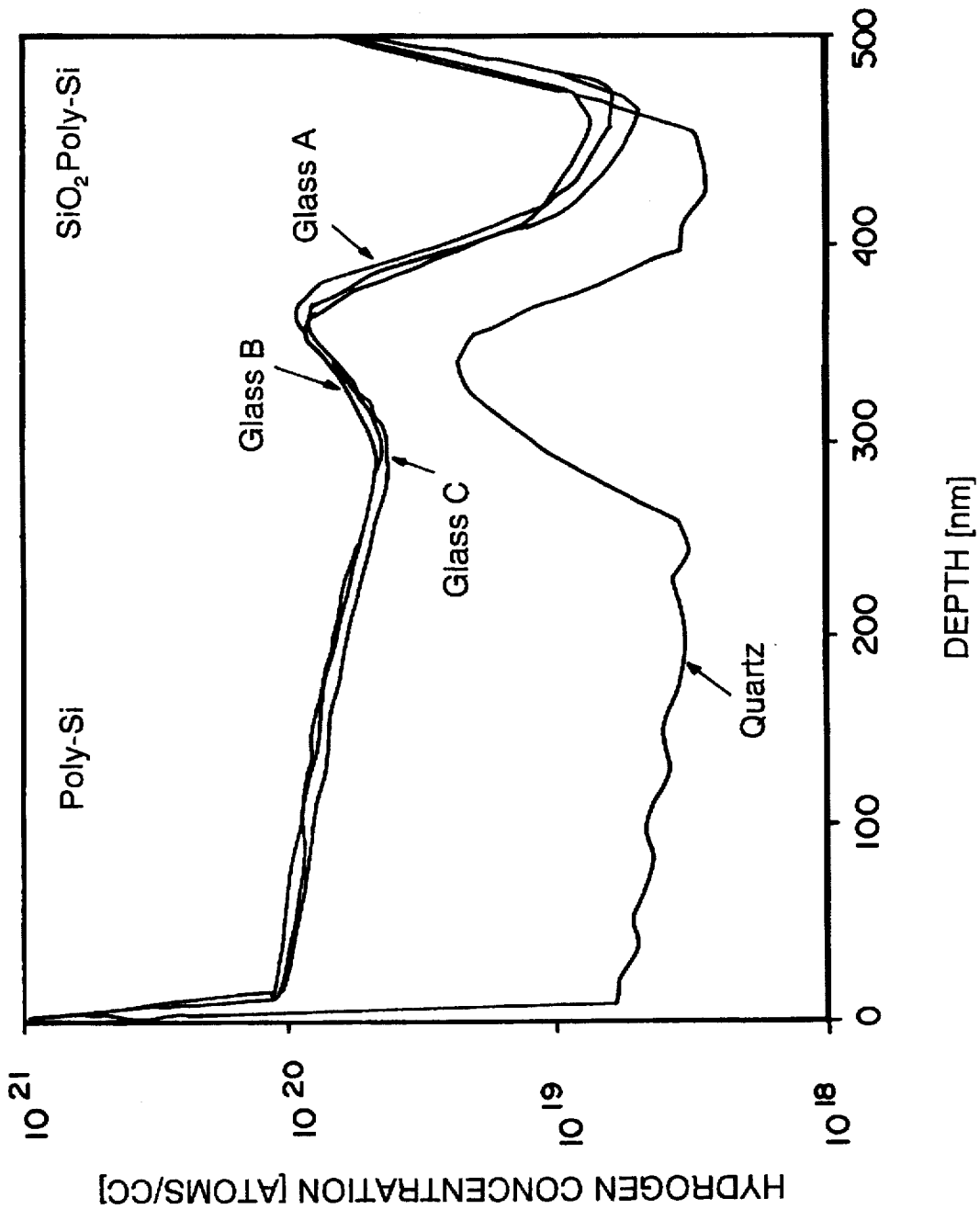
FIG. 11 is a graph illustrating a diffusion state of hydrogen in a region formed of polysilicon with added P ions of the thin film transistor in the second example according to the present invention after the hydrogen diffusing annealing is performed for 0.5 hours.
Figure 12:
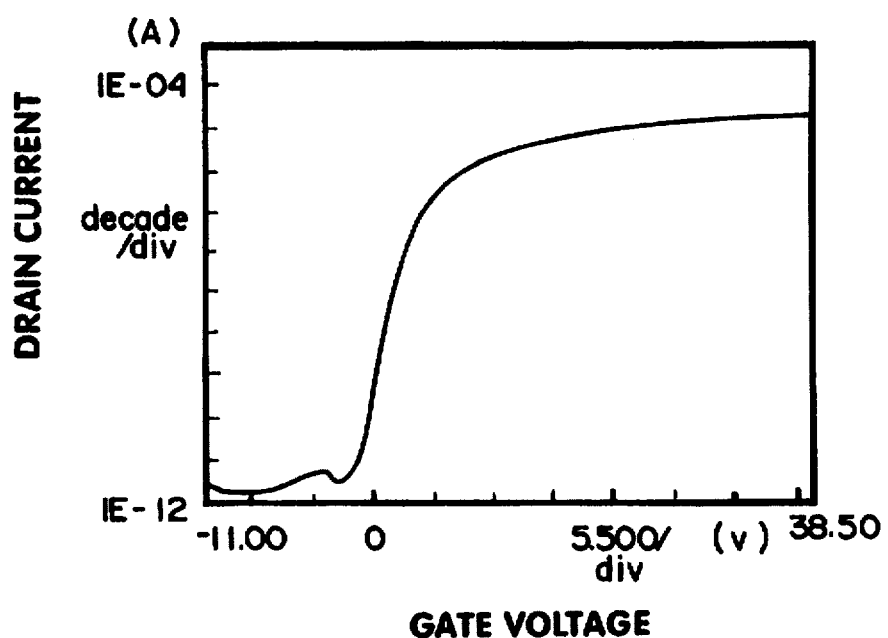
FIG. 12 is a graph illustrating the dependency of the drain current on the gate voltage concerning the thin film transistor having a substrate formed of glass A in the second example according to the present invention having.
Figure 13:
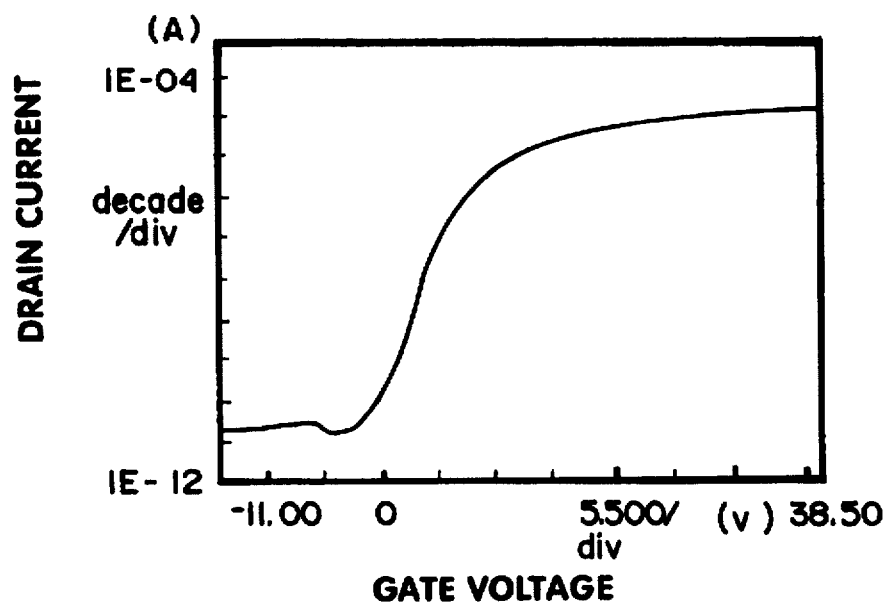
FIG. 13 is a graph illustrating the dependency of the drain current on the gate voltage concerning the thin film transistor having a substrate formed of quartz as the comparative example.

FIG. 9 shows the dependency of the threshold voltage on the time duration of the hydrogen diffusing annealing, concerning the thin film transistors in the second example according to the present invention and the thin film transistors as comparative examples. FIG. 10 shows the relationship between the thermal expansion coefficient of the substrate and the threshold voltage obtained after the hydrogen diffusing annealing is performed for 0.5 hour, concerning the thin film transistor in the second example and the thin film transistors as the comparative examples. FIG. 11 shows a diffusion state of hydrogen in the region formed of polysilicon added with P ions of the thin film transistor in the second example after the hydrogen diffusing annealing is performed for 0.5 hour. FIG. 12 shows the dependency of the drain current on the gate voltage concerning the thin film transistor having a substrate formed of glass A in the second example of the present invention, and FIG. 13 shows such dependency of the thin film transistor having a substrate formed of quartz as the comparative example. Each thin film transistor has a channel length of 50 µm, a channel width of 50 µm, and a voltage between the drain 16b and the source 16a of 0.5 V. Each transistor is obtained after performing the hydrogen diffusing annealing for 0.5 hour. As is mentioned above, Table 1 shows the thermal expansion coefficient of the three types of glass A, B, and C used for the thin film transistors in the second example and also quartz and crystal silicon used for the thin film transistors as comparative examples.

TABLE 1

| Substrate | Thermal expansion coefficient ($\times 10^{-7}$ deg$^{-1}$) |
| --- | --- |
| Glass A | 42 |
| Glass B | 37 |
| Glass C | 49 |
| Quartz | 6 |
| Crystal Silicon | 26 |

It is apparent from FIGS. 9 through 13 that, in the thin film transistors in the second example according to the present invention including a substrate having a thermal expansion coefficient of $2.6 \times 10^{-6}$ deg$^{-1}$ or more, satisfactory characteristics can be obtained in a shorter period of time of hydrogen diffusing annealing than in the thin film transistor including a substrate having a thermal expansion coefficient of less than $2.6 \times 10^{-6}$ deg$^{-1}$. Further, it is apparent from FIG. 11 that the difference in the characteristics depending on the type of substrate is caused by the difference in the speed for supplying hydrogen in the SiN:H layer to the active layer.

In the thin film transistor having a substrate formed of quartz, sufficiently good characteristics are not obtained even by hydrogen passivation in which hydrogen is diffused from the SiN:H layer into the active layer by heating. The following is considered to be one reason for this: While the annealing is performed by heating in order to diffuse hydrogen in the SiN:H layer to the active layer, defects such as voids are generated in the SiN:H layer. Hydrogen molecules are caught in the voids, and thus the ratio of hydrogen molecules introduced into the active layer is low.

The stress of the SiN:H layer depends on various parameters of layer formation. Generally, a SiN:H layer having a compressive stress with respect to a crystal silicon substrate (thermal expansion coefficient: $2.6 \times 10^{-6}$ deg$^{-1}$) at room temperature is hydrogenated at a higher efficiency than a SiN:H layer having a tensile stress at room temperature. This is because the former SiN:H layer traps hydrogen molecules at a higher efficiency, and thus allows the hydrogen molecules to be discharged into the atmosphere at a lower ratio than from the latter SiN:H layer.

For example, in the case where a substrate formed of quartz having a thermal expansion coefficient of approximately $5 \times 10^{-7}$ deg$^{-1}$ is used, the SiN:H layer has a higher tensile stress with respect to such a substrate than with respect to a silicon substrate at room temperature. However, the hydrogen diffusing annealing is usually performed at a temperature in the range of 400° C. to 550° C. In such a temperature range, the SiN:H layer has a higher compressive stress than at room temperature. This phenomenon causes defects such as voids in the SiN:H layer and peeling-off of the SiN:H layer.

By contrast, an insulating substrate having a distortion point of 850° C. or lower has a thermal expansion coefficient of $3 \times 10^{-6}$ deg$^{-1}$ to $6 \times 10^{-6}$ deg$^{-1}$. When such a substrate is used, the SiN:H layer has a substantially identical tensile stress with the case where a silicon substrate is used, or has a compressive stress, at room temperature. After the hydrogen diffusing annealing, the SiN:H layer still keeps the same tensile stress with that at room temperature or has a higher tensile stress. Accordingly, as long as no void is generated or no peeling-off occurs at room temperature, there is no problem in diffusing hydrogen to the active layer by heating. As a result, excellent characteristics can be obtained in a short period of time after hydrogen passivation starts.

Even in the case of a thin film transistor including a substrate having a thermal expansion coefficient of $2.6 \times 10^{-6}$ deg$^{-1}$ or more, hydrogen in the SiN:H layer is supplied to the active layer faster, and thus the mobility of carriers in the transistor reaches a saturation state in a shorter period of time than a thin film transistor including a substrate having a thermal expansion coefficient of less than $2.6 \times 10^{-6}$ deg$^{-1}$.

As has been described so far, according to the present invention, by use of a glass substrate having a distortion point of 850° C. or lower in a thin film transistor, generation of defects such as voids in the SiN:H layer, occurrence of peeling-off of a SiN:H layer, and other inconveniences are prevented during hydrogen diffusing annealing. As a result, satisfactory transistor characteristics can be obtained in a short period of time after start of the hydrogen passivation in which hydrogen in the SiN:H layer is diffused into an active layer.

Further, by the use of a substrate having a thermal expansion coefficient of $2.6 \times 10^{-6}$ deg$^{-1}$ or more, satisfactory transistor characteristics can be attained in a short period of time after start of hydrogen passivation.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A thin film semiconductor device, comprising:

an insulating substrate formed of an insulating material having a thermal expansion coefficient of $2.6 \times 10^{-6}$ deg.$^{-1}$ or more, a thin film transistor provided on the insulating substrate, the thin film transistor including a silicon layer as an active layer; and a silicon nitride layer formed on the silicon layer, the silicon nitride layer including hydrogen, wherein the silicon layer is passivated with hydrogen diffused from the silicon nitride layer by annealing the silicon nitride layer.

2. A thin film semiconductor device according to claim 1, wherein the insulating substrate is formed of aluminoborosilicate glass.

3. A thin film semiconductor device according to claim 2, wherein the insulating substrate of aluminoborosilicate glass has a thermal expansion coefficient of $4 \times 10^{-6}$ deg.$^{-1}$, the silicon layer is a polysilicon layer and the silicon nitride layer has a compressive stress.

4. A thin film semiconductor device according to claim 1, wherein the silicon layer is formed of polysilicon.

5. A thin film device according to claim 1, wherein the insulating substrate is formed of glass.

6. A thin film semiconductor device according to claim 1, wherein the silicon nitride layer has compressive stress.

7. A thin film semiconductor device according to claim 1, wherein the hydrogen in the silicon nitride layer is present in an atomic percent of 1% to 30%.

8. A thin film semiconductor device, comprising:

an insulating substrate formed of an insulating material having a distortion point of 850° C. or lower, a thin film transistor provided on the insulating substrate, the thin film transistor including a silicon layer as an active layer; and a silicon nitride layer formed on the silicon layer, the silicon nitride layer including hydrogen, wherein the silicon layer is passivated with hydrogen diffused from the silicon nitride layer by annealing the silicone nitride layer.

9. A thin film semiconductor device according to claim 8, wherein the insulating substrate is formed of aluminoborosilicate glass.

10. A thin film semiconductor device according to claim 9, wherein the insulating substrate of aluminoborosilicate glass has a distortion point of 670° C., the silicon layer is a polysilicon layer and the silicon nitride layer has a compressive stress.

11. A thin film semiconductor device according to claim 8, wherein the silicon layer is formed of polysilicon.

12. A thin film device according to claim 8, wherein the insulating substrate is formed of glass.

13. A thin film semiconductor device according to claim 8, wherein the silicon nitride layer has compressive stress.

14. A thin film semiconductor device according to claim 8, wherein the hydrogen in the silicon nitride layer is present in an atomic percent of 1% to 30%.

* * * * *